(12) United States Patent
Fidaner et al.

(10) Patent No.: US 9,263,611 B2
(45) Date of Patent: Feb. 16, 2016

(54) METHOD FOR ETCHING MULTI-LAYER EPITAXIAL MATERIAL

(71) Applicant: Solar Junction Corporation, San Jose, CA (US)

(72) Inventors: Onur Fidaner, San Jose, CA (US); Michael West Wiemer, Campbell, CA (US); Vijit A. Sabnis, Cupertino, CA (US); Ewelina N. Lucow, Mountain View, CA (US)

(73) Assignee: Solar Junction Corporation, San Jose, CA (US)

( * ) Notice: Subject to any disclaimer, the term of this patent is extended or adjusted under 35 U.S.C. 154(b) by 0 days.

(21) Appl. No.: 13/679,922

(22) Filed: Nov. 16, 2012

(65) Prior Publication Data

US 2013/0312817 A1     Nov. 28, 2013

Related U.S. Application Data

(60) Provisional application No. 61/561,179, filed on Nov. 17, 2011.

(51) Int. Cl.
*H01L 31/0352*    (2006.01)
*H01L 31/0693*    (2012.01)
(Continued)

(52) U.S. Cl.
CPC ...... *H01L 31/0352* (2013.01); *H01L 21/30612* (2013.01); *H01L 31/0693* (2013.01); *H01L 31/184* (2013.01); *H01L 31/186* (2013.01);
(Continued)

(58) Field of Classification Search
CPC ... Y02E 10/544; Y02E 10/50; H01L 31/0725; H01L 31/0687; H01L 31/1844; H01L 31/0735; H01L 31/03046; H01L 31/076; H01L 31/18; H01L 31/02008; H01L 31/022425; H01L 31/0352; H01L 31/0693; H01L 31/184; H01L 31/1848; H01L 31/186; H01L 31/0236; H01L 31/1884; H01L 21/30612
USPC .................................. 136/243–265
See application file for complete search history.

(56) References Cited

U.S. PATENT DOCUMENTS

| | | | |
|---|---|---|---|
| 4,838,952 A | | 6/1989 | Dill et al. |
| 5,266,518 A | * | 11/1993 | Binsma et al. .................. 438/40 |
| 6,281,426 B1 | | 8/2001 | Olson et al. |

(Continued)

FOREIGN PATENT DOCUMENTS

| | | |
|---|---|---|
| CN | 101051656 A | 10/2007 |
| EP | 0595634 A1 | 5/1994 |

(Continued)

OTHER PUBLICATIONS

M. Zaknoune, O. Schuler, F. Mollot, D. Théron, and Y. Crosnier, "Nonselective wet chemical etching of GaAs and AlGaInP for device applications", published 1998, pp. 223-226.*

(Continued)

*Primary Examiner* — Jayne Mershon
*Assistant Examiner* — Mayla Gonzalez Ramos

(57) ABSTRACT

A single-step wet etch process is provided to isolate multi-junction solar cells on semiconductor substrates, wherein the wet etch chemistry removes semiconductor materials nonselectively without a major difference in etch rate between different heteroepitaxial layers. The solar cells thus formed comprise multiple heterogeneous semiconductor layers epitaxially grown on the semiconductor substrate.

20 Claims, 9 Drawing Sheets

(51) Int. Cl.
*H01L 31/18* (2006.01)
*H01L 21/306* (2006.01)

(52) U.S. Cl.
CPC ........ *H01L 31/1844* (2013.01); *H01L 31/1848* (2013.01); *Y02E 10/544* (2013.01)

(56) References Cited

U.S. PATENT DOCUMENTS

| | | | |
|---|---|---|---|
| 7,727,795 B2 | 6/2010 | Stan et al. | |
| 8,115,097 B2 | 2/2012 | Guha et al. | |
| 2004/0166681 A1* | 8/2004 | Iles et al. | 438/689 |
| 2006/0231130 A1* | 10/2006 | Sharps et al. | 136/243 |
| 2007/0275492 A1 | 11/2007 | Huffaker et al. | |
| 2008/0265255 A1* | 10/2008 | Goyal | 257/64 |
| 2008/0276981 A1 | 11/2008 | Kinoshita et al. | |
| 2009/0269875 A1 | 10/2009 | Kato et al. | |
| 2010/0089447 A1 | 4/2010 | Basol et al. | |
| 2010/0126573 A1 | 5/2010 | Youtsey et al. | |
| 2010/0212729 A1* | 8/2010 | Hsu | 136/255 |
| 2010/0218816 A1 | 9/2010 | Guha et al. | |
| 2010/0282305 A1* | 11/2010 | Sharps et al. | 136/255 |
| 2010/0319764 A1 | 12/2010 | Wiemer et al. | |
| 2011/0041898 A1 | 2/2011 | Cornfeld | |
| 2011/0108082 A1* | 5/2011 | Werthen et al. | 136/244 |
| 2011/0303281 A1 | 12/2011 | Kodama | |
| 2011/0308599 A1 | 12/2011 | Stangl | |
| 2012/0019596 A1 | 1/2012 | Lee et al. | |
| 2012/0040487 A1 | 2/2012 | Asthana et al. | |
| 2013/0025658 A1 | 1/2013 | Bedell et al. | |
| 2013/0105930 A1 | 5/2013 | Zhang et al. | |
| 2013/0118546 A1 | 5/2013 | Jones-Albertus et al. | |
| 2013/0122638 A1 | 5/2013 | Jones-Albertus et al. | |
| 2013/0263920 A1 | 10/2013 | Fidaner | |
| 2014/0076391 A1 | 3/2014 | King et al. | |
| 2014/0097522 A1 | 4/2014 | Fidaner et al. | |
| 2014/0137930 A1 | 5/2014 | Derkacs et al. | |
| 2014/0196779 A1 | 7/2014 | Fidaner et al. | |

FOREIGN PATENT DOCUMENTS

| | | |
|---|---|---|
| EP | 1953828 A1 | 8/2008 |
| EP | 1990839 A2 | 11/2008 |
| JP | 2000-150929 A | 5/2000 |
| JP | 2005-535148 A | 11/2005 |
| JP | 2011-526737 A | 10/2011 |
| KR | 10-2011-0128155 A | 11/2011 |
| KR | 10-1193810 B1 | 10/2012 |
| WO | 2011-156017 A1 | 12/2011 |

OTHER PUBLICATIONS

Non-Final Office Action for U.S. Appl. No. 13/283,379 mailed on Feb. 6, 2013, 11 pages.
Final Office Action for U.S. Appl. No. 13/283,379 mailed on Jul. 2013, 13 pages.
Danzilio "Overview of EMCORE's Multijunction Solar Cell Technology and High Volume Manufacturing Capabilities," The International Conference on Compound Semiconductor Manufacturing Industry, 2007.
Zaknoune et al "Nonselective wet chemical etching of GaAs and AlGaInP for device applications" J. Vac. Sci. Technol. B 16, 223 (1998).
Chen et al., "Cu-plated through-wafer vias for AlGan/GaN high electron mobility transistors on Si", Journal of Vacuum Science and Technology B, vol. 27, Issue 5, 2009, 5 pages.
Law et al., "Future technology pathways of terrestrial III-V multijunction solar cells for concentrator photovoltaic systems," Solar Energy Materials & Solar Cells, vol. 94, 2010, p. 1314-1318.
Ptak et al., "Effects of temperature, nitrogen ions, and antimony on wide depletion width GaInNAs," Journal of Vacuum Science Technology, B 25(3), May/Jun. 2007, p. 955-959.
Szabo et al., "InGaAsP/InGaAs tandem cells for a solar cell configuration with more than three junctions", Phys. Stat. Sol. (RRL) 2, No. 6, Jul. 2008, p. 254-256.
Van Kerschaver et al., "Back-contact Solar Cells: A review", Progress in Photovolataics: Research and Applications, vol. 14, 2006, pp. 107-123.
Zahler et al., "High efficiency InGaAs solar cells on Si by InP layer transfer," Applied Physics Letters, 91, 012108, 2007, 3 pages.
International Search Report for PCT/US2013/070323, mailed on Feb. 17, 2014, 16 pages.
International Search Report for PCT/US2013/035123, mailed on Jun. 21, 2013, 12 pages.
International Search Report for PCT/US2014/029494, mailed on Jul. 21, 2014, 19 pages.
Non-Final Office Action for U.S. Appl. No. 13/283,379 mailed Nov. 18, 2013, 11 pages.
Final Office Action for U.S. Appl. No. 13/283,379 mailed on Apr. 30, 2014, 12 pages.
Non-Final Office Action for U.S. Appl. No. 13/679,922 mailed on Apr. 10, 2014, 17 pages.
Aiken, "High Performance anti-reflection coatings for broadband multi-junction soalr cells", Solar Energy Materials and Solar Cells, vol. 64, 2000, p. 393-404.
Aiken, "Antireflection coating design for series interconnected multi-junction solar cells" Progress in Photovoltaics: Research and Applications, vol. 8, Issue 6, 2000, p. 563-570.
Li et al., "Surface profile optimization of anti-reflection gratings for solar cells", Optik-int. J. Light Electron Optik, vol. 122, 2011, p. 2078-2082.
Moys, "The theory of double-layer antireflection coatings", Thin Solid Film, vol. 21, 1974, p. 145-157.
Taiwan Search Report and Written Opinion for Application No. 102112423, mailed on Feb. 16, 2015, 3 pages.
European Search Report for Application No. 12250166.1, mailed on Jul. 27, 2015, 8 pages.

* cited by examiner

METHOD FOR ETCHING MULTI-LAYER EPITAXIAL MATERIAL

This application claims benefit under 35 U.S.C. §119(e) to U.S. Provisional Application No. 61/561,179 filed on Nov. 17, 2011, which is incorporated by reference in its entirety.

This application relates to a single-step wet etch process and the use of the process to isolate multijunction solar cells on semiconductor substrates, wherein the wet etch chemistry removes semiconductor materials nonselectively without a major difference in etch rate between different heteroepitaxial layers. The solar cells thus formed comprise multiple heterogeneous semiconductor layers epitaxially grown on the semiconductor substrate.

BACKGROUND

The present invention relates to the field of multijunction solar cells incorporating a plurality of heterogeneous layers of epitaxial material on semiconductor substrates. More particularly, the present invention relates to an improved method of patterning epitaxial layers using a single step wet etch process.

Solar cells are important renewable energy sources that have become widely deployed for both space and terrestrial applications. Today, the highest efficiency solar cells are realized using the multijunction solar cell approach. Multijunction solar cells typically consist of two, three, or more junctions, i.e., subcells, that are serially connected in a stack, as illustrated in FIG. 1A. The junctions are typically realized by growing a plurality of heteroepitaxial layers 9 on a semiconductor substrate 12. Each junction 114, 115, and 116 is designed to absorb from a separate portion of the solar energy spectrum, allowing for solar energy conversion with high efficiency. The junctions are separated by interconnection regions 117 and 118. The epitaxial layers 9 that make up the multijunction solar cells are chosen from a variety of semiconductor materials with different optical and electrical properties in order to absorb different portions of the solar energy spectrum.

Fabrication of multijunction solar cells is conventionally carried out on the wafer scale using conventional semiconductor processing methods that are known to those skilled in the art. A summary of processing steps for making a typical multi junction solar cell is found in Danzilio et al., cited below.

An important step in the fabrication of multijunction solar cells, illustrated in FIG. 1B, is the isolation of individual cells 100 on a semiconductor substrate 12, herein referred to as "mesa isolation." Mesa isolation is done to eliminate electrical contact between adjacent solar cells on the same wafer, which then allows the mechanical separation of the individual cells 100 (also referred to as singulation) to take place without disturbing the edges of each individual cell.

In the mesa isolation step, the epitaxial layers 9 must be removed on all four edges of the individual solar cell chips, as can be seen in FIG. 1A and FIG. 2. If the bottom-most junction in the stack uses the substrate 12 as seen in FIG. 2 as the base region of the junction (e.g., germanium), then mesa isolation must extend into the substrate region, resulting in partially etched substrate 12, such that the etch depth into the substrate exceeds the minority carrier diffusion length in that base region.

Mesa isolation of cells can be achieved by using a number of techniques including, but not limited to, dry etching, partial (or full) cut using techniques such as saw or laser dicing, and wet etching. These techniques, as used in the prior art, can be reviewed briefly as follows:

Dry Etching: Dry etching is the removal of semiconductor material by exposing the material to plasma of reactive gases in vacuum chambers. Dry etching is a well-established processing technique in the semiconductor industry. However, it has found limited use in solar cell manufacturing due to low throughput and high costs involved in equipment setup and maintenance. Consequently, dry etching is not typically used for mesa isolation of multijunction solar cells.

Partial Cut: The partial cut technique uses a dicing saw or laser beam to cut partially through the wafer to isolate solar cells electrically. Mechanical removal of semiconductor material results in chipping and damage on sidewalls, which leads to poor electrical performance of the chip. It is difficult to control the actively absorbing area of the solar cell, resulting in a variation in performance. Furthermore, partial cut is also a low throughput technique. Nevertheless the partial cut technique is relatively cost-effective and is sometimes used.

Wet Etching: Wet etching is the removal of semiconductor material using chemicals in liquid phase. Wet etching is the preferred method found in the prior art, because it is cost effective, does not require sophisticated processing equipment, and wafer throughput is high. The present invention is a wet etching technique for multijunction solar cell processing.

Multijunction solar cells are formed of multiple epitaxial layers with different electrical, optical, and chemical properties. Semiconductor materials used in multijunction solar cells include, but are not limited to, indium gallium phosphide, indium phosphide, gallium arsenide, aluminum gallium arsenide, indium gallium arsenide, dilute nitride compounds, and germanium. For ternary and quaternary compound semiconductors, a wide range of alloy ratios can be used.

There are several wet etch chemistries commonly used in compound semiconductor manufacturing. A comprehensive list of wet etchants, along with etch rates and selectivity relationships was published by Clawson, *Materials Science and Engineering*, 31 (2001) 1-438. Typically, the wet etchants used for etching one class of semiconductor material are selective and will not etch certain other classes of semiconductor material. The selectivity of a wet etchant may also depend on alloy concentration of the compounds. Consequently, etching a full stack of epitaxial layers in multijunction solar cells for mesa isolation typically has required application of multiple wet etch chemistries.

Using multiple applications of selective (or nonselective) etchants typically results in jagged, non-smooth, and/or irregular mesa sidewall profile. FIG. 4 depicts an example of a multijunction solar cell found in the prior art, as would be produced by an image of a scanning electron microscope. In the fabrication of the solar cell shown in FIG. 4, different etch chemistries were used to etch each of the junctions 114, 115, and 116. Due to differences in chemistries and selectivity relationships, each of the three junctions and the substrate 112 has a distinctively different etch profile, resulting in the jagged, non-smooth, and/or irregular shape shown in FIG. 4. The shape of mesa sidewalls will vary depending on the semiconductor materials used in the solar cell and the chemicals used to etch them. Typically, such jagged mesa sidewall profiles result in larger sidewall surface areas (for a given mesa size and etch depth) compared to a uniform sidewall profile. Such larger sidewall surface areas may result in a higher leakage current on the perimeter of the solar cell, which in turn may result in reduced open circuit voltage and efficiency in multijunction solar cells.

In addition to perimeter leakage current, the use of multiple etchants has other disadvantages compared to single-etch chemistries including, for example:

1. Longer processing time.
2. Increased difficulty in controlling the etch rate and relative undercut of layers.
3. More chemical, water, and energy consumption during fabrication.
4. More chemical waste generation.
5. Multiple photolithography steps may be required to prevent damage to the sidewalls.
6. Uneven etching of different semiconductor layers.

Conventional processes have not been adequate to fabricate a cost-effective, high performance multijunction solar cell. Consequently there have been attempts to find nonselective etchants. The prior attempts are briefly described.

Turala et al. (CPV-7 Las Vegas, Nev. 2011) disclose a method using a high-viscosity bromine solution to etch III-V materials used in multijunction solar cells on germanium substrates. The solution proposed by Turala et al., however, requires the use of a silicon nitride hard mask, which must be deposited using plasma enhanced chemical vapor deposition. Using dielectric hard mask is not the preferred method in fabrication of solar cells because the use of photoresist masking, common in all semiconductor manufacturing, is much more cost-effective.

In a different approach, Zaknoune et al., *J. Vac. Sci. Technol. B* 16, 223 (1998), report an etching procedure that is nonselective for gallium arsenide and aluminum gallium indium phosphide, wherein the aluminum gallium indium phosphide quaternary compound has 35% aluminum phosphide, 15% gallium phosphide, and 50% indium phosphide. The etching procedure described by Zaknoune et al. uses a diluted solution of hydrochloric acid, iodic acid, and water to etch 300 nm of the quaternary compound grown on gallium arsenide substrate using a photoresist mask. The main application areas described in the paper by Zaknoune et al. are heterojunction bipolar transistors (HBT), various quantum well lasers (QWL), and high electron mobility transistors (HEMT) for which large conduction and valance band discontinuities are required. These devices are majority carrier devices wherein the large bandgap materials are typically used as barrier materials for majority carriers. Zaknoune et al. describes a system with one layer of epitaxy and does not recognize any sidewall problem related to multilayer epitaxy that is characteristic of solar cells.

The device requirements for multijunction solar cells are significantly different than for HBTs, QWLs, and HEMTs, largely because multijunction solar cells are minority carrier devices. Consequently the procedure described by Zahnoune et al. has no direct application to etching multijunction solar cell structures, which include a wide variety of semiconductor materials with a wide range of bandgaps (typically 0.67 eV to 2.25 eV).

The requirements for the mesa isolation step in the fabrication of multijunction solar cells can be summarized as follows:

1. Etchants that do not affect standard photoresist materials, such that conventional photolithography techniques can be used to define mesa patterns on semiconductor substrates and the exposed areas can be removed using wet etch chemistry. In particular, dielectric hard masks can thereby be avoided when defining mesa patterns.
2. A nonselective etch that etches all materials in the range of bandgaps from 0.67 eV (germanium) to 2.25 eV (gallium phosphide). FIG. 3 shows some of these semiconductor materials and their alloys in the range of bandgap energies.
3. Small sidewall surface area to result in reduced leakage current.
4. Ability to change and control the relative etch rates of epitaxial layers within the solar cell, for example through changing the composition of the etchant. An etchant that etches all materials in the bandgap range with similar etch rate may be preferred.
5. Using a single mixture of chemicals such that the wet etch for mesa isolation can be completed in a single step with minimal waste generation and water and energy consumption.

What is needed is a fabrication process better adapted to multijunction solar cell manufacturing.

SUMMARY

According to the invention, a single-step wet etch process is provided to isolate multijunction solar cells on semiconductor substrates prior to singulation, wherein the wet etch chemistry removes semiconductor materials nonselectively without a major difference in etch rate between different heteroepitaxial layers. The solar cells thus formed comprise multiple heterogeneous semiconductor layers epitaxially grown on the semiconductor substrate without ragged sidewalls.

The present invention includes a mixture of the following chemicals to realize mesa isolation: (1) iodic acid ($HIO_3$); (2) hydrochloric acid (HCl); and (3) water ($H_2O$)

The mole ratios of these chemicals and the temperature of the chemical mixture can be varied to change the overall etch rate and the relative etch rates of different epitaxial materials. Agitation during etching may be used to control the etch rate and uniformity.

In application, examples of processes taking place at the mesa isolation step are listed as follows:

1. Patterning photoresist 10 using standard photolithography techniques to define mesa areas 6 on the substrate (FIG. 5A).
2. Etching the wafers in a mixture of the above listed chemicals to remove the epitaxial material 11 and portion of the substrate 12 in the exposed areas between adjacent mesa structures (FIG. 5B).
3. Removing the photoresist layer 10 (FIG. 5C).

The process steps of the present invention constitute the mesa isolation step in fabrication of multijunction solar cells. The steps described herein are not to be taken in a limiting sense. Other embodiments may be used and structural or logical changes in the process may be made provided that removal of the epitaxial material in exposed areas is achieved by using a mixture including iodic acid, hydrochloric acid, and water. It is to be understood that the present invention is a process module that can be inserted in all multijunction solar cell processes that require mesa isolation.

The present invention solves a number of critical problems that are not addressed in the prior art, as described in the background section:

1. The technique etches all semiconductor materials and alloys typically used in multijunction solar cells including but not limited to:

Germanium
Indium phosphide
Aluminum phosphide
Gallium phosphide
Indium arsenide
Aluminum arsenide Gallium arsenide Dilute nitride compounds 2. The etch rate does not depend on crystallographic orientation.

3. The method does not significantly etch common photoresist materials typically used in standard photolithography.

4. The technique does not significantly etch dielectrics, such as common dielectric layer stacks used as anti-reflection coatings.

5. The technique employs a single mixture of chemicals and the mesa isolation step can be realized in a single step.

6. The mesa sidewall areas obtained through the use of the present invention are generally smaller compared with those found in the prior art.

The invention will be better understood by reference to the following detailed description in connection with the accompanying drawings

DETAILED DESCRIPTION

Figure 1A:
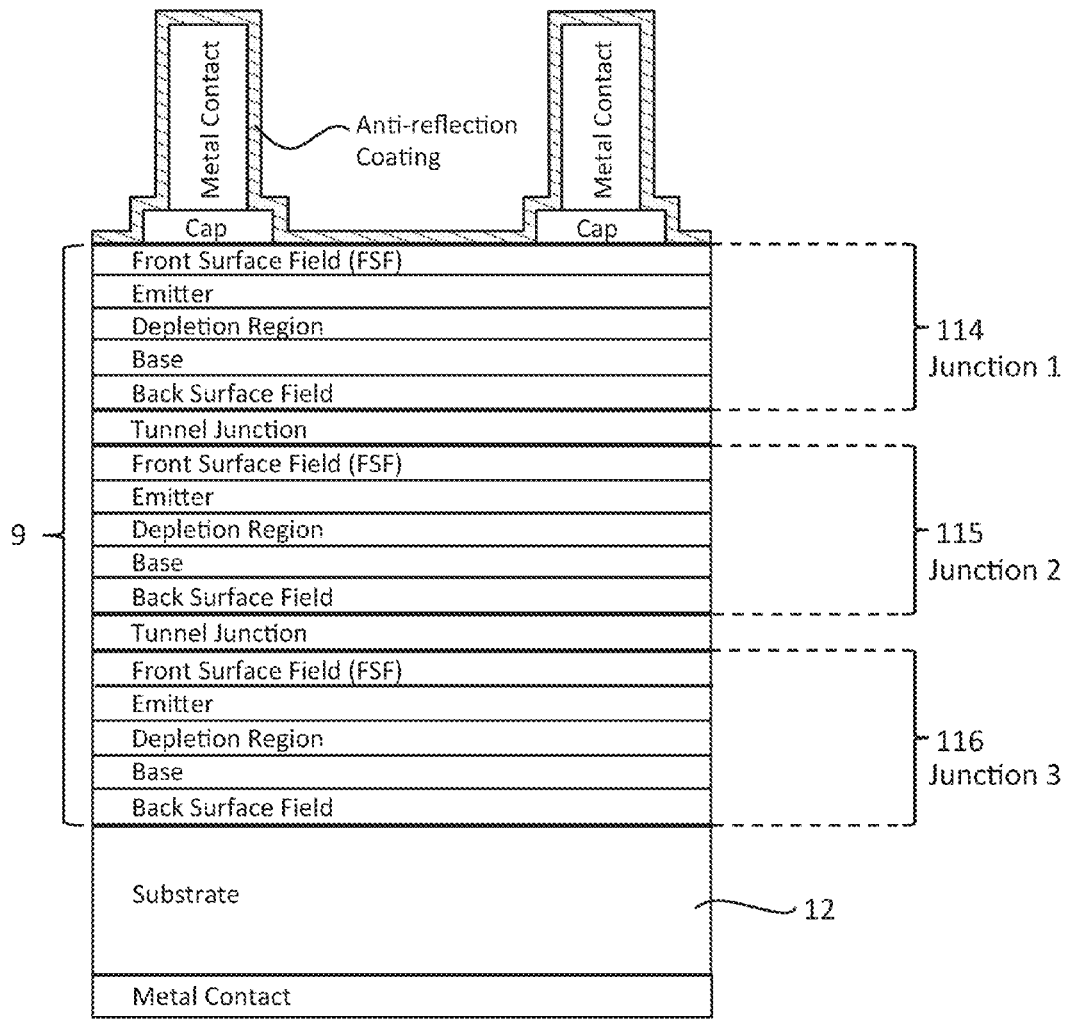
FIG. 1A is a cross-sectional diagram of a multijunction solar cell in which the invention could be used.
Figure 1B:
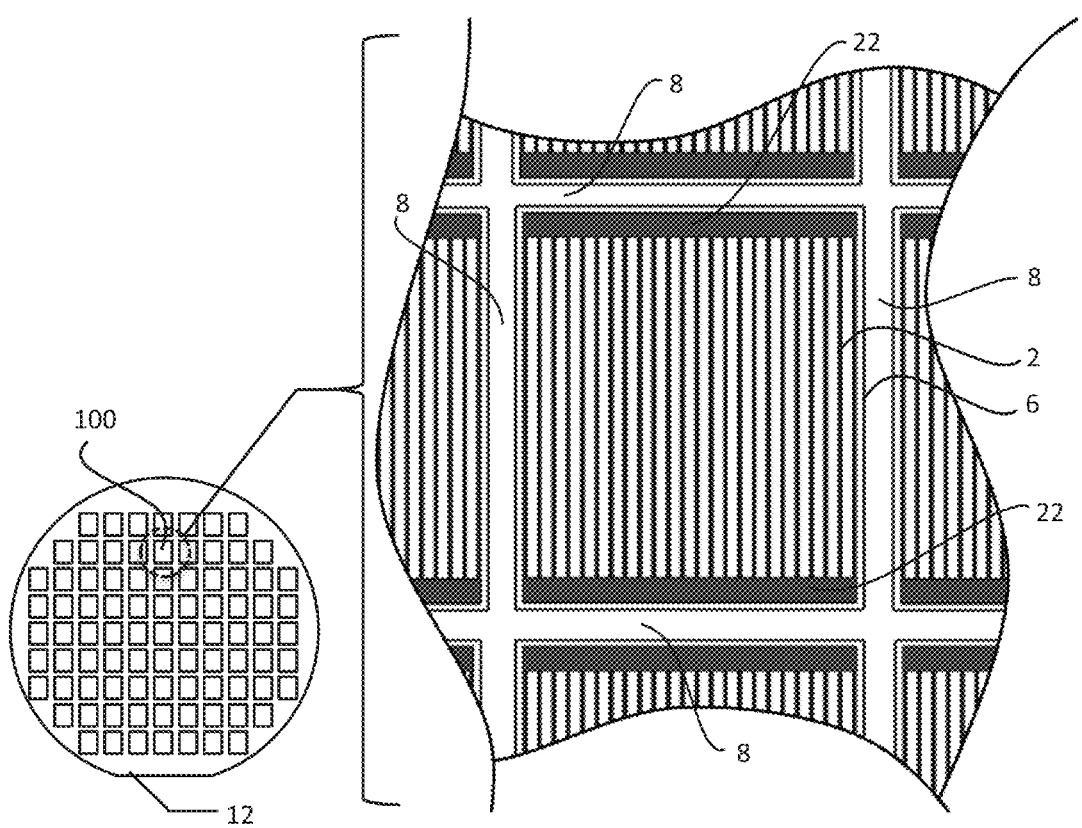
FIG. 1B is a top plan view of cells as found in the prior art.
Figure 2:
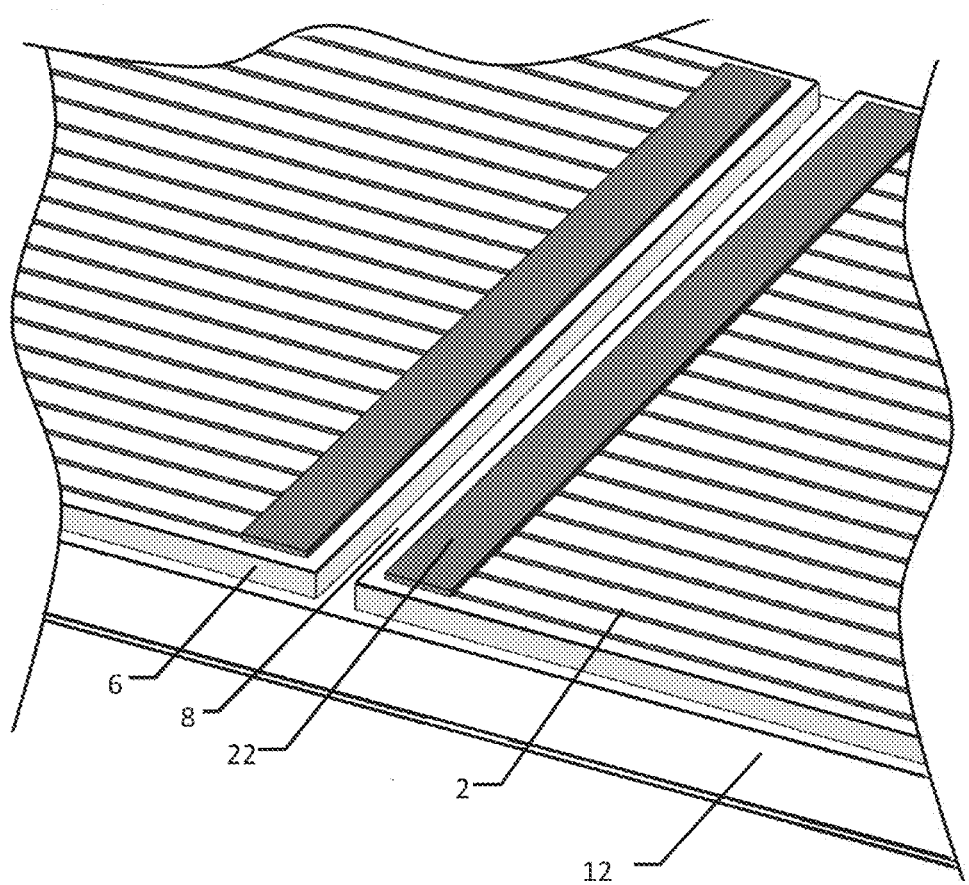
FIG. 2 is a close-up view of a portion of the mesa isolation processed structure of the prior art. Individual cells on a semiconductor substrate are isolated by removing grown epitaxial layers and a portion of the substrate in areas between adjacent mesa structures.

FIG. 1B and FIG. 2 illustrate of a portion of a mesa isolation processed solar cell structure 100 on a wafer 12. In top view, the structures of the prior art and of the present invention are indistinguishable. Individual solar cells 100 on the semiconductor substrate 12 are isolated by removing grown epitaxial layers and a portion of the substrate 12 in areas 8 (etched regions) between adjacent mesa structures. Bus bars 22 connect grid lines 2. The mesa structure 6 is bounded by edges along the boundaries of the etched regions 8 as hereinafter explained.

Figure 3:
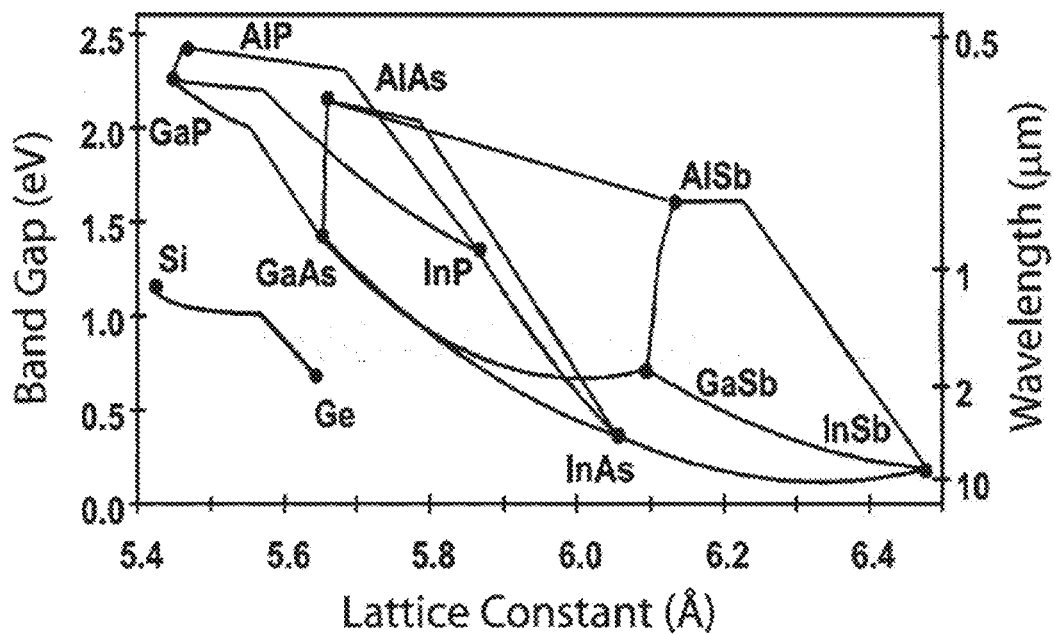
FIG. 3 is a graph showing the lattice constant-bandgap relationship of common compound and elemental semiconductors and the alloys typically used in multijunction solar cells.
Figure 4:
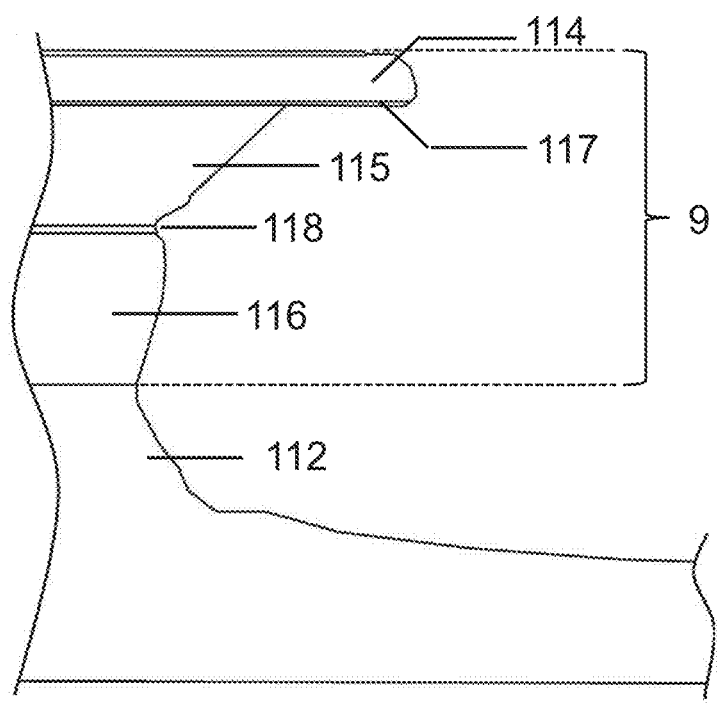
FIG. 4 is a cross-sectional view of an exemplary multijunction solar cell of the prior art.
Figure 6:
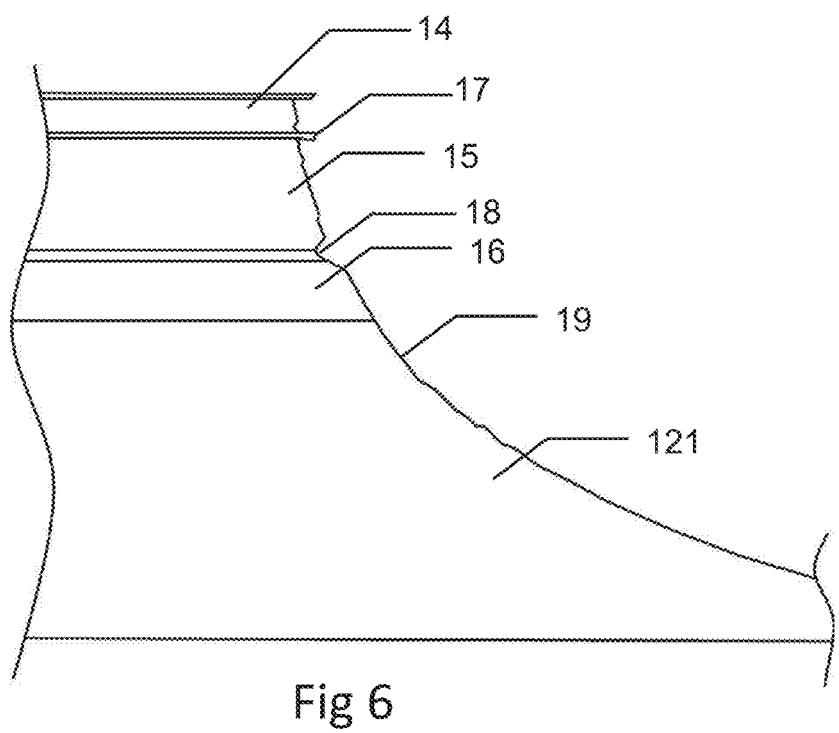
FIG. 6 is a cross-sectional view of a multijunction solar cell manufactured using the wet etch process of the present invention.

FIG. 3 is a graph showing the lattice constant-bandgap relationship of common compound and elemental semiconductors and the alloys typically used in multijunction solar cells. In mesa isolation it is a requirement to etch through all of the semiconductor materials used in multijunction solar cells. Whereas the prior art as represented by FIG. 4 yields an inconsistent cross section during etch, the present invention, as shown in FIG. 6, does not.

The mixture according to certain embodiments of the wet etch process of the invention, comprises iodic acid, hydrochloric acid, and water prepared in the molar ratios of 1:62:760, respectively. The said molar ratios of iodic acid and hydrochloric acid can be within a variance of ±5.0%, such that the molar ratios in the mixture are within the ranges (0.95-1.05):(59-65):760, for iodic acid, hydrochloric acid, and water, respectively. Preparation in the laboratory or manufacturing process is in a 1:2:3 ratio by volume, wherein the aqueous solution of hydrochloric acid is 38.0%±3.0% by weight and the aqueous solution of iodic acid is 6.6%±1.0% by weight. It is within the contemplation of the invention to use another solute or liquid mixtures besides water in the wet etch process, although water is the most readily available. Similarly, other acids of different molar concentration could be substituted for hydrochloric acid to yield the same result. However, it is the iodic acid $HIO_3$ in the above concentration range that is considered efficacious for the purposes of this invention to produce substantially inwardly curved sidewalls through all heterogeneous layers of epitaxy.

Figure 5A:
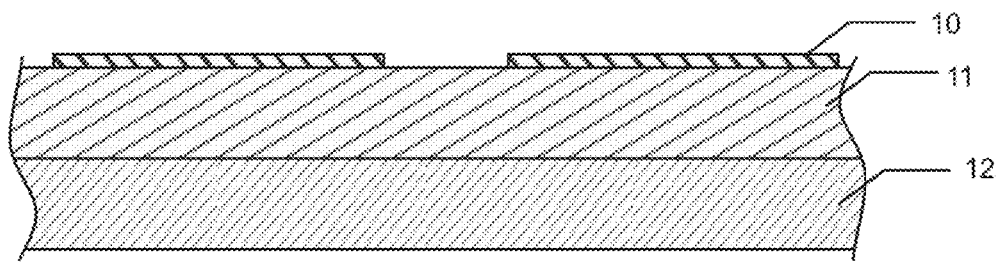
FIGS. 5A, 5B, and 5C show results of processing steps in accordance with the present invention.
Figure 5B:
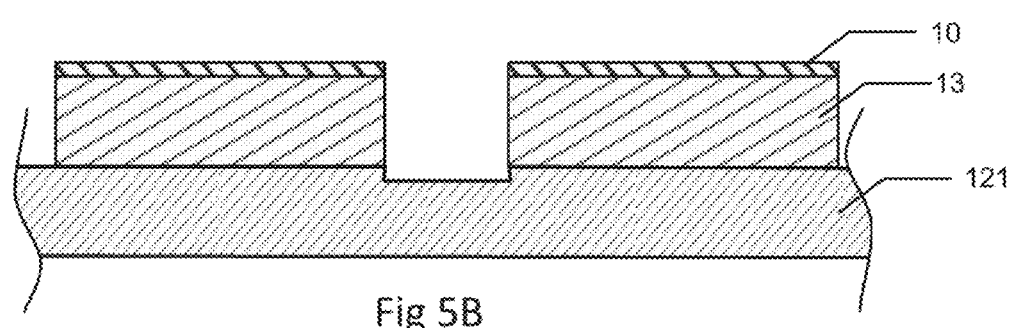
Figure 5C:
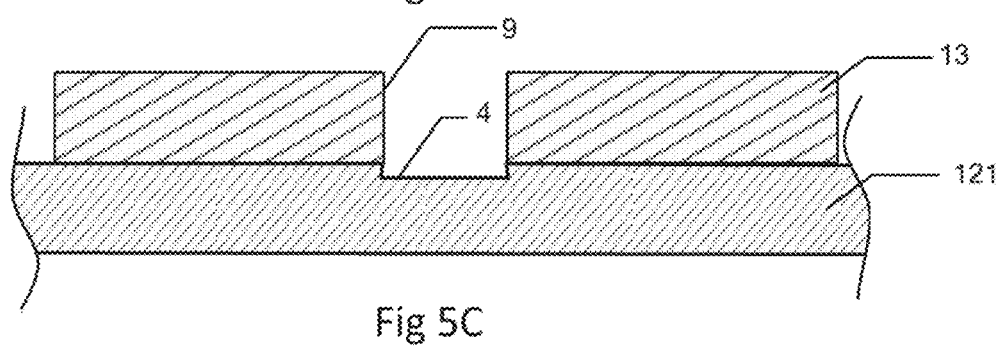

FIGS. 5A, 5B, and 5C show processing steps in accordance with the present invention as previously summarized. The layers of a multijunction solar cell are represented by heteroepitaxial material stack 11 on an unmodified substrate 12. Photoresist 10 overlays the epitaxial stack 11 (FIG. 5A). When etched according to the invention (FIG. 5B) in a reservoir of the aqueous etch solution, heteroepitaxial stack 11 is transformed into individual elements 13 that form cells 100 (FIG. 1) penetrating the substrate, now designated 121, and producing mesa structures 6, as hereinafter depicted in FIG. 6 according to the invention. (Not shown is the optional process of protecting the underside of the substrate 12 against the etch solution.)

The resulting cross-sectional shape (FIG. 6) after the mesa isolation step is a side wall profile characterized by a substantially inwardly curved profile, that is, having a substantially macroscopically smooth surface without significant undercutting of a junction region compared to other junction regions. As compared with the prior art, a substantially inwardly curved profile is indicative of nonselective etch produced by the wet etch process of the invention. Interconnection regions 17 and 18 between junctions 14, 15, and 16 often exhibit different etch rates compared to the semiconductors used in the junctions. As shown in FIG. 6, methods provided by the present disclosure produce a mesa side wall profile that is characterized by a macroscopically smooth profile from junction 14 and gradually widening toward and along substrate 121. The mesa sidewall profile is further characterized by minimal undercutting beneath the uppermost interconnection layer and interconnection layer 17, and a modest etch-back at interconnection layer 18. In particular, aluminum containing layers may show a larger undercut compared to other layers. It is to be understood that traces of iodine may be found on etched surfaces 19 (FIG. 6) as a result of the present invention, including sidewalls of mesa structures 9 and exposed portions of the substrate 121 (FIG. 5C).

In certain embodiments the wafers are agitated in the etch solution to control etch rate and provide etch uniformity across wafers.

Figure 7A:
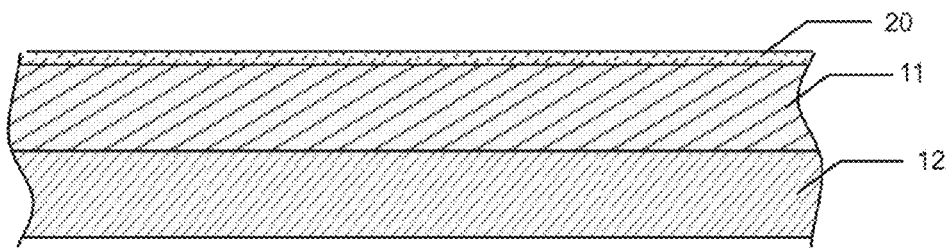
FIGS. 7A, 7B, and 7C show results of processing steps of one embodiment of the present invention wherein a patterned photoresist mask 21 is used to pattern the mesa structures.
Figure 7B:
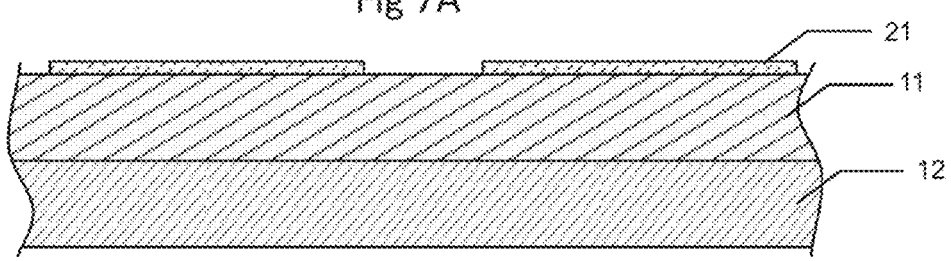
Figure 7C:
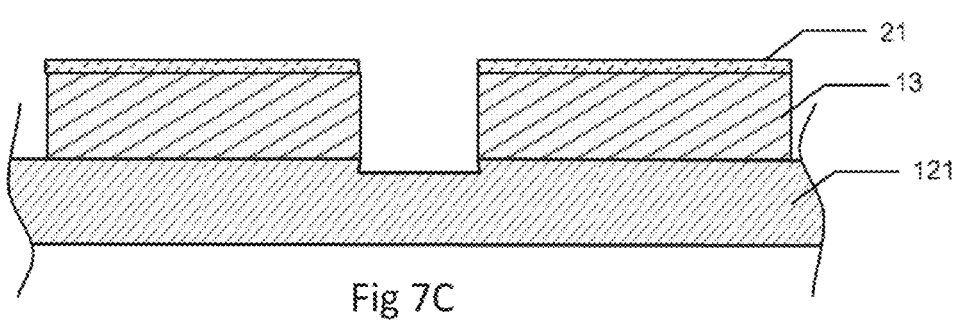
Figure 8A:
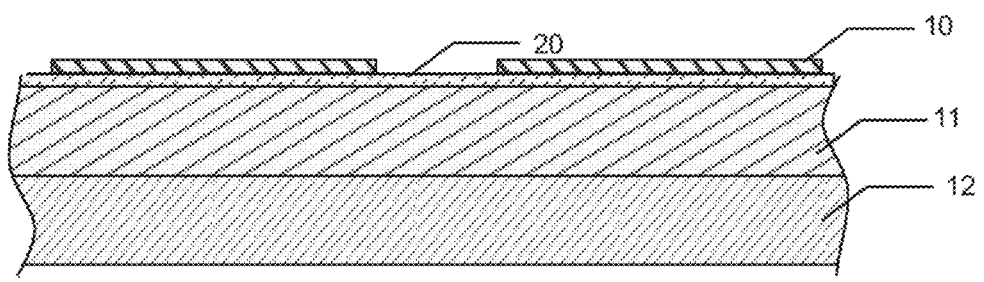
FIGS. 8A, 8B, and 8C show results of processing steps of another embodiment of the present invention wherein patterned photoresist 10 is first used to pattern dielectric 21, and thereafter, retained during mesa etch.
Figure 8B:
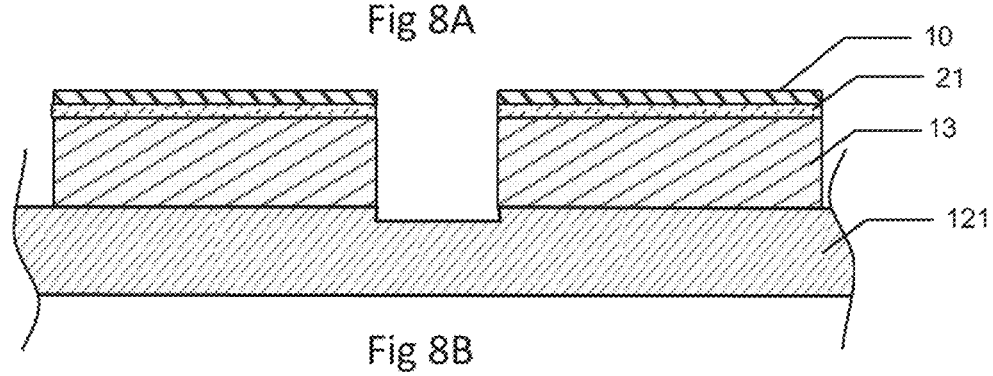
Figure 8C:
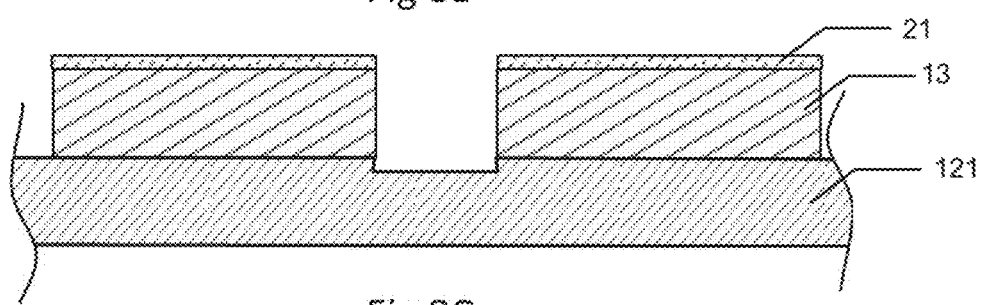

In another embodiment, anti-reflection coating (ARC) is used as a dielectric hard mask for mesa isolation. The process steps in this embodiment are depicted in FIG. 7. Anti-reflection coating deposition 20 is done before the mesa isolation step and patterned ARC 21 is used to protect the solar cells during the removal of heteroepitaxial layers around the cells using the present invention. In a variation of this embodiment (FIG. 8), the ARC 20 is patterned using photoresist 10. After the ARC etch is completed the photoresist 10 is retained during mesa isolation as well.

In certain embodiments of the invention, the volumetric ratio of hydrochloric acid in the mixture is 10%-50% and the volumetric ratio of iodic acid in the mixture is 10%-50%, wherein the aqueous solution of hydrochloric acid is 38.0%±3.0% by weight and the aqueous solution of iodic acid is 6.6%±1.0% by weight. It is to be understood the same molar ratios of the constituent chemicals can be provided using different volumetric ratios with different molarities in the aqueous solutions used. During processing, the temperature of the mixture is maintained between 10° C. and 140° C.

In another specific embodiment of the invention, the volumetric ratio of hydrochloric acid is 30%-35% and the volumetric ratio of iodic acid is 14%-19%, using the said molarities in the aqueous solutions of the constituent chemicals, and the temperature of the mixture is maintained between 30° C. and 45° C.

The etching methods provided by the present disclosure can be used to fabricate solar cells including multijunction solar cells. Accordingly, solar cells including multijunction solar cells fabricated using the methods disclosed herein are provided.

In certain embodiments, a solar cell device comprises a multijunction photovoltaic cell comprising a first subcell and a second subcell overlying the first subcell, wherein the multijunction photovoltaic cell is characterized by mesa sidewalls formed by a nonselective wet etch process, wherein the mesa sidewalls are substantially inwardly curved.

In certain embodiments of a solar cell, at least one of the first subcell and the second subcell comprises a base layer comprising an alloy comprising one or more elements from group III of the periodic table, nitrogen, arsenic, and an element selected from Sb, Bi, and a combination thereof; and the first subcell and the second subcell are substantially lattice matched.

In certain embodiments of a solar cell, the first subcell and the second subcell are substantially lattice matched to a material selected from Si, Ge, SiGe, GaAs, and InP.

In certain embodiments of a solar cell, the first subcell comprises a base layer selected from GaInNAsSb, GaInNAsBi, GaInNAsSbBi, GaNAsSb, GaNAsBi, and GaNAsSbBi.

In certain embodiments of a solar cell, the solar cell comprises a gallium arsenide-containing material underlying the first subcell.

In certain embodiments of a solar cell, the solar cell comprises a germanium-containing material underlying the first subcell.

In certain embodiments of a solar cell, the first subcell comprises a germanium-containing material.

In certain embodiments of a solar cell, the nonselective wet etch process used to form the mesa sidewalls comprises the use of a single etchant mixture comprising hydrochloric acid, iodic acid, and water.

In certain embodiments of a solar cell, the etchant mixture used to form the mesa sidewalls comprises a volumetric ratio of hydrochloric acid of 10% to 50%; and a volumetric ratio of iodic acid of 10% to 50%; and the etchant mixture is characterized by a temperature from 10° C. to 140° C.

In certain embodiments of a solar cell, the etchant mixture used to form the mesa sidewalls comprises a volumetric ratio of hydrochloric acid of 30% to 35%; and a volumetric ratio of iodic acid of 14% to 19%; and the etchant mixture is characterized by a temperature from 30° C. to 45° C.

The invention has been explained with respect to specific embodiments. Other embodiments will be evident to those of ordinary skill in the art. Therefore, the invention is not intended to be limited, except as indicated by the appended claims.

What is claimed is:

1. A method for making a solar cell device comprising the steps of:
   providing a wafer comprising multijunction photovoltaic cells, wherein the multijunction photovoltaic cells comprise:
   a substrate;
   a first subcell overlying the substrate; and
   a second subcell overlying the first subcell;
   patterning the wafer with a mesa etch pattern using photolithography; and
   etching in exposed areas the multijunction photovoltaic cells according to the mesa etch pattern using a single etchant mixture comprising hydrochloric acid, iodic acid, and water, for yielding mesa isolation of individual multijunction photovoltaic cells comprising mesa sidewalls, wherein,
   the mesa sidewalls comprise the substrate, the first subcell, and the second subcell;
   the mesa sidewalls are characterized by a macroscopically smooth surface without significant undercutting that substantially continuously widens toward and along the substrate; and
   the sidewalls comprise traces of iodine.

2. The method of claim 1, wherein the etchant mixture comprises:
   a volumetric ratio of hydrochloric acid of 10% to 50%; and
   a volumetric ratio of iodic acid of 10% to 50%;
   wherein the mixture has a temperature 10° C. to 140° C.

3. The method of claim 1, wherein the etchant mixture comprises:
   a volumetric ratio of hydrochloric acid of 30% to 35%; and
   a volumetric ratio of iodic acid of 14% to 19%;
   wherein the mixture has a temperature of 30° C. to 45° C.

4. The method of claim 1, wherein patterning comprises using a photoresist, using a dielectric hard mask, or using both a photoresist and a dielectric hard mask.

5. The method of claim 1, wherein patterning comprises using a photoresist to pattern a dielectric hard mask, and the photoresist is retained during removal of the heteroepitaxial layers during mesa etching.

6. The method of claim 1, wherein etching comprises agitating the wafer.

7. A solar cell device comprising:
   a multijunction photovoltaic cell comprising a first subcell overlying a substrate; and a second subcell overlying the first subcell; and
   mesa sidewalls comprising sidewalls of the substrate, the first subcell, and the second subcell, wherein:
   the mesa sidewalls are characterized by a macroscopically smooth surface without significant undercutting that substantially continuously widens toward and along the substrate; and
   wherein the sidewalls comprise traces of iodine.

8. The solar cell device of claim 7, wherein
   at least one of the first subcell and the second subcell comprises a base layer comprising an alloy comprising one or more elements from group III of the periodic table, nitrogen, arsenic, and an element selected from Sb, Bi, and a combination thereof; and
   the first subcell and the second subcell are lattice matched.

9. The solar cell device of claim 7, wherein the first subcell and the second subcell are lattice matched to a material selected from Si, Ge, SiGe, GaAs, and InP.

10. The solar cell device of claim 7, wherein the first subcell comprises a base layer selected from GaInNAsSb, GaInNAsBi, GaInNAsSbBi, GaNAsSb, GaNAsBi, and GaNAsSbBi.

11. The solar cell device of claim 7, comprising a gallium arsenide-containing material underlying the first subcell.

12. The solar cell device of claim 7, comprising a germanium-containing material underlying the first subcell.

13. The solar cell device of claim 7, wherein the first subcell comprises a germanium-containing material.

14. The method of claim 1, wherein at least one of the first subcell and the second subcell comprises a base layer comprising an alloy comprising one or more elements from group III of the periodic table, nitrogen, arsenic, and an element selected from Sb, Bi, and a combination thereof; and the first subcell and the second subcell are lattice matched.

15. The method of claim 1, wherein the first subcell and the second subcell are lattice matched to a material selected from Si, Ge, SiGe, GaAs, and InP.

16. The method of claim 1, wherein the first subcell comprises a base layer selected from GaInNAsSb, GaInNAsBi, GaInNAsSbBi, GaNAsSb, GaNAsBi, and GaNAsSbBi.

17. The method of claim 1, comprising a gallium arsenide-containing material underlying the first subcell.

18. The method of claim 1, comprising a germanium-containing material underlying the first subcell.

19. The method of claim 1, wherein the first subcell comprises a germanium-containing material.

20. The solar cell device of claim 7, wherein the first subcell is characterized by a first bandgap and a second subcell characterized by a second bandgap, wherein the first bandgap is less than the second bandgap and the first bandgap and the second bandgap are selected from a bandgap within a range of 0.67 eV to 2.25 eV.

* * * * *